(12) United States Patent
Nodera et al.

(10) Patent No.: US 10,038,098 B2
(45) Date of Patent: Jul. 31, 2018

(54) METHOD FOR MANUFACTURING THIN FILM TRANSISTOR, THIN FILM TRANSISTOR AND DISPLAY PANEL

(71) Applicant: Sakai Display Products Corporation, Sakai-shi, Osaka (JP)

(72) Inventors: Nobutake Nodera, Sakai (JP); Shigeru Ishida, Sakai (JP); Ryohei Takakura, Sakai (JP); Yoshiaki Matsushima, Sakai (JP); Takao Matsumoto, Sakai (JP); Kazuki Kobayashi, Sakai (JP); Taimi Oketani, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 0 days.

(21) Appl. No.: 15/327,615

(22) PCT Filed: Nov. 7, 2014

(86) PCT No.: PCT/JP2014/079619
§ 371 (c)(1),
(2) Date: Jan. 19, 2017

(87) PCT Pub. No.: WO2016/072024
PCT Pub. Date: May 12, 2016

(65) Prior Publication Data
US 2017/0162709 A1    Jun. 8, 2017

(51) Int. Cl.
*H01L 29/786*  (2006.01)
*G02F 1/1362*  (2006.01)

(52) U.S. Cl.
CPC .. *H01L 29/78663* (2013.01); *G02F 1/136277* (2013.01); *G02F 2001/136295* (2013.01)

(58) Field of Classification Search
CPC .................................................. H01L 29/78663
See application file for complete search history.

(56) References Cited

U.S. PATENT DOCUMENTS 5,243,202 A * 9/1993 Mori ................ H01L 21/02164
257/59
5,367,179 A * 11/1994 Mori ................... H01L 21/0217
257/59

(Continued)

FOREIGN PATENT DOCUMENTS

JP    2004-349299 A    12/2004
JP    2008-85091 A    4/2008

(Continued)

*Primary Examiner* — Eugene Lee
(74) *Attorney, Agent, or Firm* — Rudy J. Ng; Bret E. Field; Bozicevic, Field & Francis LLP

(57) ABSTRACT

The method for manufacturing a thin film transistor includes the processes of forming a gate electrode on a surface of a substrate, forming an insulation film on the surface of the substrate on which the gate electrode is formed, forming a first amorphous silicon layer on the surface of the substrate on which the insulation film is formed, annealing a plurality of required places separated from each other on the first amorphous silicon layer by irradiating the same with an energy beam to change the required places to a polysilicon layer, forming a second amorphous silicon layer by covering the polysilicon layer, forming an n+ silicon layer on a surface of the second amorphous silicon layer, etching the first amorphous silicon layer, the second amorphous silicon layer and the n+ silicon layer.

7 Claims, 13 Drawing Sheets

(56) References Cited

U.S. PATENT DOCUMENTS

| | | | |
|---|---|---|---|
| 6,093,586 A * | 7/2000 | Gosain | H01L 21/2026 148/DIG. 100 |
| 2005/0014379 A1 * | 1/2005 | Choi | H01L 27/3244 438/700 |
| 2005/0218403 A1 * | 10/2005 | Kuo | H01L 29/66765 257/59 |
| 2009/0050896 A1 | 2/2009 | Kaitoh et al. | |
| 2009/0095957 A1 * | 4/2009 | Miyake | H01L 27/1229 257/59 |
| 2011/0024763 A1 | 2/2011 | Noda et al. | |
| 2011/0147755 A1 * | 6/2011 | Miyairi | H01L 29/66765 257/60 |

FOREIGN PATENT DOCUMENTS

| | | |
|---|---|---|
| JP | 2011-29411 A | 2/2011 |
| JP | 2011-33703 A | 2/2011 |
| JP | 5226259 B2 | 7/2013 |

\* cited by examiner

METHOD FOR MANUFACTURING THIN FILM TRANSISTOR, THIN FILM TRANSISTOR AND DISPLAY PANEL

CROSS-REFERENCE TO RELATED APPLICATIONS

This application is the national phase under 35 U.S.C. § 371 of PCT International Application No. PCT/JP2014/079619 which has an International filing date of Nov. 7, 2014 and designated the United States of America.

FIELD

The present invention relates to a method for manufacturing a thin film transistor, a thin film transistor and a display panel including the thin film transistor.

BACKGROUND

A thin film transistor (TFT) type liquid crystal display includes a TFT substrate and a color filter substrate having red (R), green (G) and blue (B) colors, in which the TFT substrate and the color filter substrate are bonded to each other at a required gap, and liquid crystal is injected and sealed therebetween, and may display an image by controlling transmittance of light by liquid crystal molecules for each pixel.

In the TFT substrate, data lines and scanning lines are wired in a lattice shape in longitudinal and lateral directions, and pixels including the TFTs are formed in places where the data lines and the scanning lines intersect with each other. In addition, a driving circuit for driving the data lines and the scanning lines, which include the TFTs, is formed around a display region including a plurality of pixels.

There are two types of TFTs, an amorphous silicon (a-Si) TFT in an amorphous state and a polycrystalline silicon (p-Si) in a polycrystalline state depending on the crystalline state of a semiconductor (silicon). The a-Si TFT has a high resistance and a low leakage current (leak current). In addition, the p-Si TFT has dramatically higher mobility of electrons than that of the a-Si TFT. For this reason, the a-Si TFT having the low leakage current is used for each pixel included in the display region, and the p-Si TFT having the higher mobility of electrons is used for the driving circuit.

Meanwhile, from a structure viewpoint of the TFT, generally, the a-Si TFT uses a bottom gate structure in which a gate electrode is disposed in the lowermost layer, and the p-Si TFT uses a top gate structure in which the gate electrode is disposed on an upper side of a semiconductor film. However, if TFTs having different structures from each other are formed on one substrate, a manufacturing process becomes complicated.

In this regard, a liquid crystal display device having a structure in which, in the TFT of the bottom gate structure, an a-Si layer is formed by covering a p-Si layer to prevent the p-Si layer and the source and drain electrodes from directly contacting with each other, is disclosed (see Japanese Patent Publication No. 5226259).

SUMMARY

However, in the liquid crystal display device of Japanese Patent Publication No. 5226259, the a-Si layer is formed on an entire substrate, and the a-Si layer is changed to the p-Si layer in a polycrystalline state by irradiating the entire substrate with a laser.

In addition, after the crystallization, the p-Si layer is formed at a required position via exposure, development and etching processes. Further, the a-Si layer covering the p-Si layer is also subjected to the exposure, development and etching processes to form the a-Si layer at a required position. For this reason, two processes of the exposure, development, and etching processes are required, respectively.

In consideration of the above-mentioned circumstances, it is an object of the present disclosure to provide a method for manufacturing a thin film transistor capable of shortening a manufacturing process, a thin film transistor, and a display panel including the thin film transistor.

A method for manufacturing a thin film transistor according to the present disclosure includes the processes of forming a gate electrode on a surface of a substrate, forming an insulation film on the surface of the substrate on which the gate electrode is formed, forming a first amorphous silicon layer on the surface of the substrate on which the insulation film is formed, annealing a plurality of required places separated from each other on the first amorphous silicon layer by irradiating an energy beam to change the required places to a polysilicon layer, forming a second amorphous silicon layer by covering the polysilicon layer, forming an n+ silicon layer on a surface of the second amorphous silicon layer, forming a required pattern on the n+ silicon layer, etching the first amorphous silicon layer, the second amorphous silicon layer and the n+ silicon layer, and forming a source electrode and a drain electrode on the n+ silicon layer after the etching, wherein the annealing process is adapted to irradiate the energy beam so that at least one electrode of the source electrode and the drain electrode is not overlapped with the plurality of required places at positions in which they are projected onto the surface of the substrate.

According to the present disclosure, the gate electrode is formed on the surface of the substrate, and the insulation film is formed on the surface of the substrate on which the gate electrode is formed. The first amorphous silicon layer (a-Si film) is formed on the surface of the substrate on which the insulation film is formed. In the annealing process, the plurality of required places separated from each other on the first amorphous silicon layer are irradiated with the energy beam to change the required places to the polysilicon layer (poly-Si film). Each of the required places is an upper side of the gate electrode, and is a channel region between the source and the drain. For the energy beam, it is possible to use, for example, an excimer laser of ultraviolet light in which absorption of the amorphous silicon layer (a-Si film) is large. A laser beam from a laser light source is made incident on a multi-lens array, for example, thereby the laser beam is partially irradiated to each of required places via different optical paths for each lens. As a result, in the first amorphous silicon layer, only the region (plurality of required places separated from each other) to be the channel region is selectively changed to the polysilicon layer (poly-Si film).

By covering the polysilicon layer became a polycrystalline state by the annealing process, the second amorphous silicon layer is formed, and the n+ silicon layer is formed on the second amorphous silicon layer. The n+ silicon layer (n+ Si film) is a contact layer with the source electrode and the drain electrode, and is a semiconductor layer having a high impurity concentration such as phosphorus or arsenic. In addition, a required pattern is formed on the n+ silicon layer. The required pattern may be appropriately determined according to an arrangement or structure of the source electrode, the drain electrode and the semiconductor layer. Then, in order to make the semiconductor layer have a required structure, the first amorphous silicon layer, the second amorphous silicon layer and the n+ silicon layer are etched, and the source electrode and the drain electrode are formed on the n+ silicon layer after the etching.

As compared to a case in which, after the amorphous silicon layer formed on the whole of the substrate surface is changed to the polysilicon layer by irradiating the entire surface of the substrate with an energy beam (for example, laser), each process of exposure, development and etching is performed on the polysilicon layer to form the channel region, according to the above-described manufacturing method, the entire surface of the substrate is not irradiated with the energy beam (for example, laser), but, in the first amorphous silicon layer, only the region to be the channel region is partially irradiated with the energy beam, such that it is possible to form the channel region only by the annealing process. Therefore, each process of exposure, development and etching for forming the channel region is not required, and the manufacturing process may be shortened.

In addition, the annealing process is adapted to irradiate the energy beam so that at least one electrode of the source electrode and the drain electrode is not overlapped with the plurality of required places at the positions in which they are projected onto the surface of the substrate. The second amorphous silicon layer is formed by covering the polysilicon layer which is the channel region, and the source electrode and the drain electrode are formed on the upper side of the second amorphous silicon layer through the n+ silicon layer. That is, since the second amorphous silicon layer is provided so as to prevent the source and drain electrodes and the channel region from directly contacting with each other, the feature of having a low leakage current (leak current) is used. The positions, in which at least one electrode of the source electrode and the drain electrode and the required place are projected onto the surface of the substrate, are adapted so as not to be overlapped with each other, such that the leakage current may be further reduced.

A thin film transistor according to the present disclosure includes a gate electrode formed on a surface of a substrate, a polysilicon layer formed on an upper side of the gate electrode, an amorphous silicon layer and an n+ silicon layer formed on the upper side of the polysilicon layer, and a source electrode and a drain electrode formed on the n+ silicon layer, wherein at least one electrode of the source electrode and the drain electrode and the polysilicon layer are adapted so as not to be overlapped with each other at positions in which they are projected onto the surface of the substrate.

According to the present disclosure, the thin film transistor includes: the gate electrode formed on the surface of the substrate; the polysilicon layer (poly-Si film) formed on the upper side of the gate electrode; the amorphous silicon layer (a-Si film) and the n+ silicon layer (n+ Si film) formed on the upper side of the polysilicon layer; and the source electrode and the drain electrode formed on the n+ silicon layer. The polysilicon layer is the channel region. In addition, the n+ silicon layer is a contact layer with the source electrode and the drain electrode, and is a semiconductor layer having a high impurity concentration such as phosphorus or arsenic. Further, the positions, in which at least one electrode of the source electrode and the drain electrode and the polysilicon layer are projected onto the surface of the substrate, are adapted so as not to be overlapped with each other.

Since the second amorphous silicon layer is provided so as to prevent the source and drain electrodes and the channel region from directly contacting with each other, the feature of having a low leakage current (leak current) is used. The positions, in which at least one electrode of the source electrode and the drain electrode and the polysilicon layer are projected onto the surface of the substrate, are adapted so as not to be overlapped with each other, such that the leakage current may be further reduced.

A thin film transistor according to the present disclosure, wherein the amorphous silicon layer includes, a first amorphous silicon layer which is formed around the polysilicon layer and has a thickness approximately equal to the thickness of the polysilicon layer, and a second amorphous silicon layer formed on the surfaces of the polysilicon layer and the first amorphous silicon layer.

According to the present disclosure, the amorphous silicon layer includes the first amorphous silicon layer which is formed around the polysilicon layer and has a thickness approximately equal to the thickness of the polysilicon layer, and the second amorphous silicon layer formed on the surfaces of the polysilicon layer and the first amorphous silicon layer. That is, the polysilicon layer is obtained in such a way that, in the first amorphous silicon layer formed on the upper side of the gate electrode, only a region corresponding to the channel region is changed to the polysilicon layer which is the polycrystalline state. Therefore, it can be seen that each processing of exposure, development and etching for forming the channel region is not performed. Further, since the second amorphous silicon layer is provided so as to prevent the source and drain electrodes and the channel region from directly contacting with each other, the feature of having a low leakage current (leak current) is used.

A thin film transistor according to the present disclosure, wherein a boundary surface between the polysilicon layer and the first amorphous silicon layer is substantially perpendicular to the surface of the substrate.

Since the polysilicon layer is formed by partial laser annealing, the boundary surface between the polysilicon layer and the first amorphous silicon layer is substantially perpendicular to the surface of the substrate. That is, a line width of the polysilicon layer on the gate electrode side is not wider than the line width thereof on the source electrode and the drain electrode sides, such that it is easy to prevent at least one electrode of the source electrode and the drain electrode from being overlapped with the polysilicon layer at the positions in which they are projected onto the surface of the substrate. In addition, since the gate insulation film of the channel region is not exposed to etching, a deterioration in TFT characteristics may be suppressed.

A display panel according to the present disclosure, includes the thin film transistor according to the present invention.

According to the present disclosure, it is possible to provide a display panel capable of shortening a manufacturing process.

According to the present disclosure, it is possible to delete the exposure, development and etching processes by as much as one process, and shorten the manufacturing process.

The above and further objects and features of the invention will more fully be apparent from the following detailed description with accompanying drawings.

DETAILED DESCRIPTION

Figure 1:
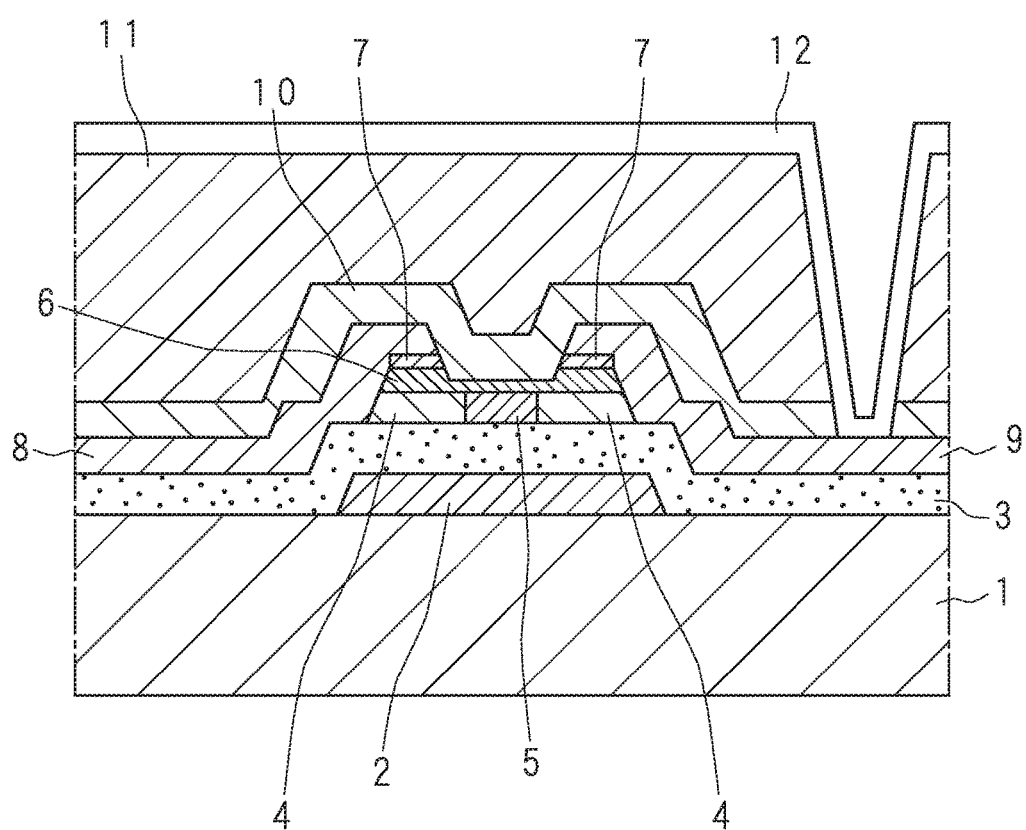
FIG. 1 is a schematic cross-sectional view of main components illustrating a first example of a structure of a thin film transistor according to the present embodiment.

Hereinafter, embodiments of the present invention will be described with reference to the accompanying drawings illustrating the embodiments thereof. FIG. 1 is a schematic cross-sectional view of main components illustrating a first example of a structure of a thin film transistor according to the present embodiment. As illustrated in FIG. 1, the thin film transistor (also referred to as a TFT substrate) includes a gate electrode 2 formed on a surface of a glass substrate 1 (also referred to as a substrate), and a gate insulation film 3 (for example, an $SiO_2$ film, $SiO_2$/SiN film laminate, SiN film, or the like) formed by covering the gate electrode 2.

A polysilicon layer (poly-Si film) 5 is formed on a surface of the gate insulation film 3 and an upper side of the gate electrode 2. A first amorphous silicon layer (a-Si film) 4 having a thickness approximately equal to the thickness of the polysilicon layer 5 is formed around the polysilicon layer 5. A second amorphous silicon layer (a-Si film) 6 is formed on the surfaces of the polysilicon layer 5 and the first amorphous silicon layer 4. The first amorphous silicon layer 4 and the second amorphous silicon layer 6 are collectively and simply referred to as an amorphous silicon layer.

An n+ silicon layer (n+ Si film) 7 is formed at a required position on the surface of the second amorphous silicon layer 6. The n+ silicon layer 7 is a contact layer with a source electrode 8 and a drain electrode 9, and is a semiconductor layer having a high impurity concentration such as phosphorus or arsenic.

The source electrode 8 and the drain electrode 9 respectively having a required pattern are formed on the surface of the n+ silicon layer 7, side faces of the second amorphous silicon layer 6 and the first amorphous silicon layer 4, and the surface of the gate insulation film 3.

The polysilicon layer 5 corresponds to a channel region. In addition, the first amorphous silicon layer 4, the second amorphous silicon layer 6 and the polysilicon layer 5 are also collectively referred to as a semiconductor layer. The TFT including the gate electrode 2, the semiconductor layer, the source electrode 8, the drain electrode 9, and the like illustrated in FIG. 1 shows a TFT for a driving circuit for driving pixels. Since the TFT for the driver circuit is required to operate at a high speed, the polysilicon layer 5 having a high electron mobility is used for the channel region.

A passivation film 10 made of SiN is formed on the entire TFT substrate so as to cover the source electrode 8 and the drain electrode 9, and an organic film 11 is formed on a surface of the passivation film 10 to flatten the surface thereof. Through holes are formed in required positions of the passivation film 10 and the organic film 11 so that a pixel electrode 12 and the drain electrode 9 (and the source electrode 8) conduct with each other through the through holes. The pixel electrode 12 is made of ITO which is a transparent conductive film.

In the above-described bottom gate configuration, since the polysilicon layer 5 has a thickness approximately equal to the thickness of the first amorphous silicon layer 4 around thereof, the polysilicon layer 5 is obtained in such a way that, in the first amorphous silicon layer 4 formed on the upper side of the gate electrode 2, only a region corresponding to the channel region (a plurality of required places separated from each other) is changed to the polysilicon layer 5 which is a polycrystalline state by annealing treatment using an energy beam (for example, a laser). Therefore, it can be seen that each processing of exposure, development and etching for forming the polysilicon layer 5 as the channel region is not performed.

In addition, since the polysilicon layer 5 is formed by partial laser annealing to be described below, a boundary surface between the polysilicon layer 5 and the first amorphous silicon layer 4 is substantially perpendicular to the surface of the substrate 1. That is, if the polysilicon layer is formed by photo etching, the side face of the polysilicon layer does not become substantially perpendicular to the surface of the substrate 1, but becomes a taper shape to be wider toward the gate electrode side. On the other hand, if the polysilicon layer 5 is formed by laser annealing as in the present embodiment, a line width of the polysilicon layer 5 on the gate electrode 2 side is not wider than the line width thereof on the source electrode 8 and the drain electrode 9 sides (that is, the line width on the gate electrode 2 side and the line width on the source electrode 8 and the drain electrode 9 sides are approximately equal to each other), such that it is easy to prevent at least one electrode of the source electrode 8 and the drain electrode 9 from being overlapped with the polysilicon layer 5 at positions in which they are projected onto the surface of the substrate 1. In addition, since the gate insulation film 3 of the channel region is not exposed to etching, a deterioration in TFT characteristics may be suppressed.

In addition, since the second amorphous silicon layer 6 is provided so as to prevent the source and drain electrodes 8 and 9 and the channel region from directly contacting with each other, a feature of having a low leakage current (leak current) is used. As a result, by using the polysilicon layer 5 as the channel region, an operating speed of the TFT for the driver circuit may be increased, and the second amorphous silicon layer 6 is provided between the polysilicon layer 5 and the source and drain electrodes 8 and 9, such that a decrease in the leakage current may be achieved.

Figure 2:
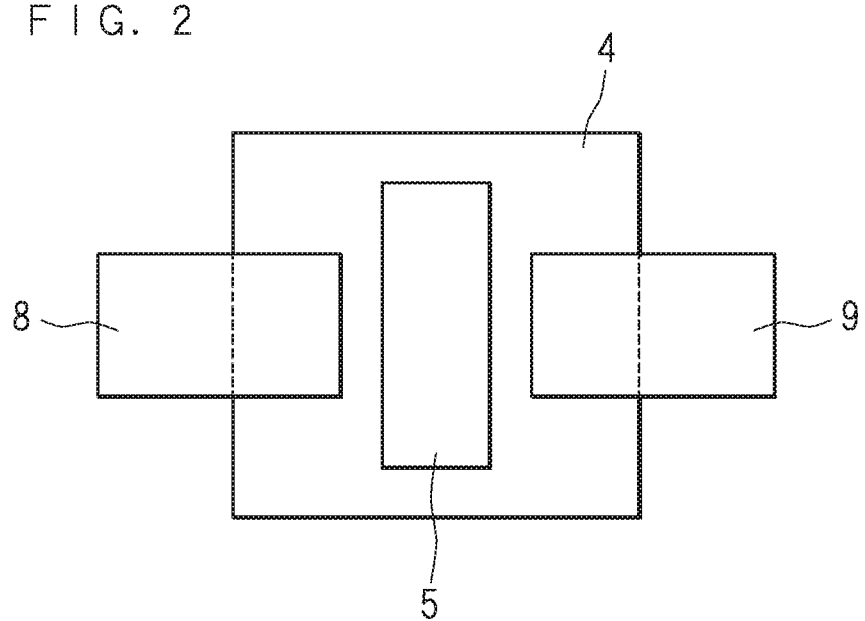
FIG. 2 is a schematic plan view of the main components illustrating the first example of the structure of the thin film transistor according to the present embodiment.

FIG. 2 is a schematic plan view of the main components illustrating the first example of the structure of the thin film transistor according to the present embodiment. FIG. 2 illustrates a positional relationship between the first amorphous silicon layer 4, the polysilicon layer 5, the source electrode 8 and the drain electrode 9 in a plan view for the sake of simplicity. As illustrated in FIG. 2, the first amorphous silicon layer 4 is formed around the polysilicon layer 5. In addition, although not illustrated in the drawings, the second amorphous silicon layer 6 having substantially the same dimension as the dimension (longitudinal and lateral dimensions) of the first amorphous silicon layer 4 is formed on the surfaces of the polysilicon layer 5 and the first amorphous silicon layer 4.

In the first example, positions, in which the source and drain electrodes 8 and 9 and the polysilicon layer 5 are projected onto the surface of the glass substrate 1, are adapted so as not to be overlapped with each other. Thereby, the leakage current between the source and drain electrodes 8 and 9 and the polysilicon layer 5 may be further reduced.

Figure 3:
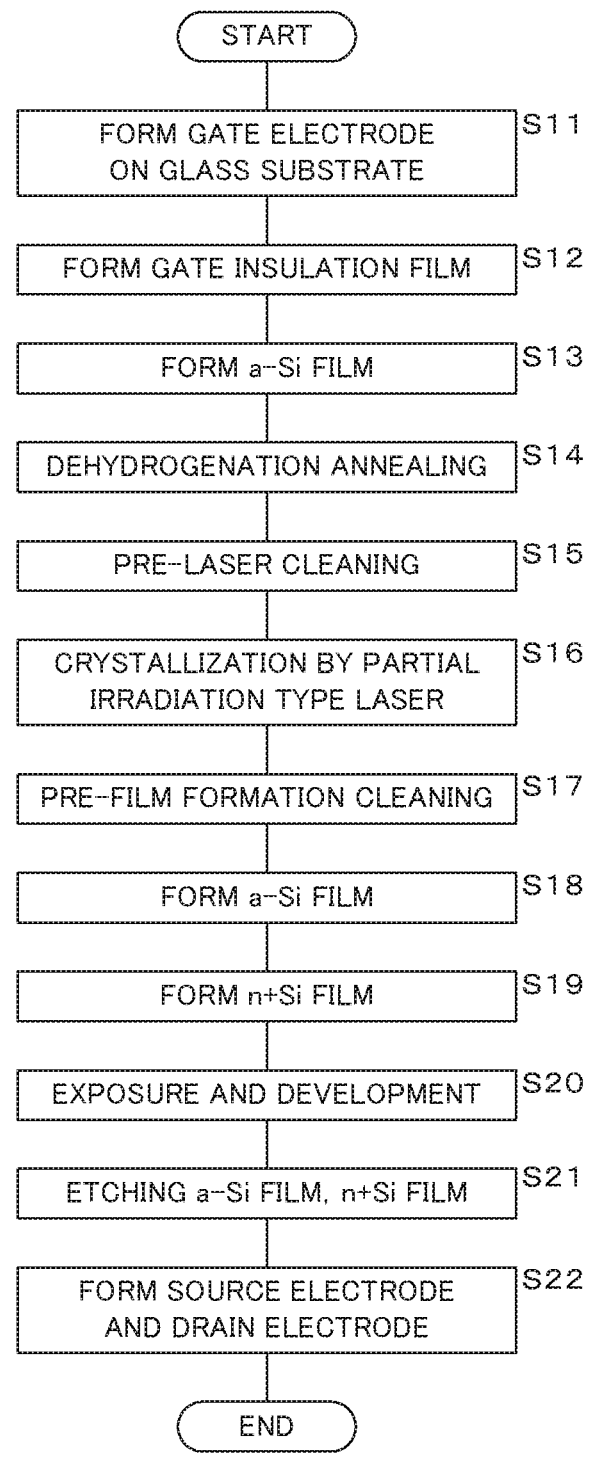
FIG. 3 is a flow chart of manufacturing processes illustrating an example of a method of manufacturing the thin film transistor according to the present embodiment.

FIG. 3 is a flow chart of manufacturing processes illustrating an example of a method of manufacturing the thin film transistor according to the present embodiment. Hereinafter, the manufacturing processes of the thin film transistor according to the present embodiment will be described. As illustrated in FIG. 3, the gate electrode 2 is formed on the glass substrate 1 (S11), and the gate insulation film 3 is formed on the surface of the glass substrate 1 by covering the gate electrode 2 (S12).

Then, the a-Si film 4 as the first amorphous silicon layer is formed on the surface of the glass substrate 1 on which the gate insulation film 3 is formed (S13). In order to laser anneal the a-Si film 4, dehydrogenation annealing treatment is performed (S14), and cleaning prior to laser annealing is performed (S15).

Next, crystallization of the a-Si film 4 by a partial irradiation type laser is performed (S16). The crystallization process is an annealing process (also referred to as a laser annealing process). For example, the required place is changed to the polysilicon layer (poly-Si film) 5 by irradiating a required place of the a-Si film 4 with an energy beam through a multi-lens array. The required place is the upper side of the gate electrode 2, and is a channel region between the source and the drain. For the energy beam, it is possible to use, for example, an excimer laser of ultraviolet light in which absorption of the amorphous silicon layer (a-Si film) is large.

Figure 4:
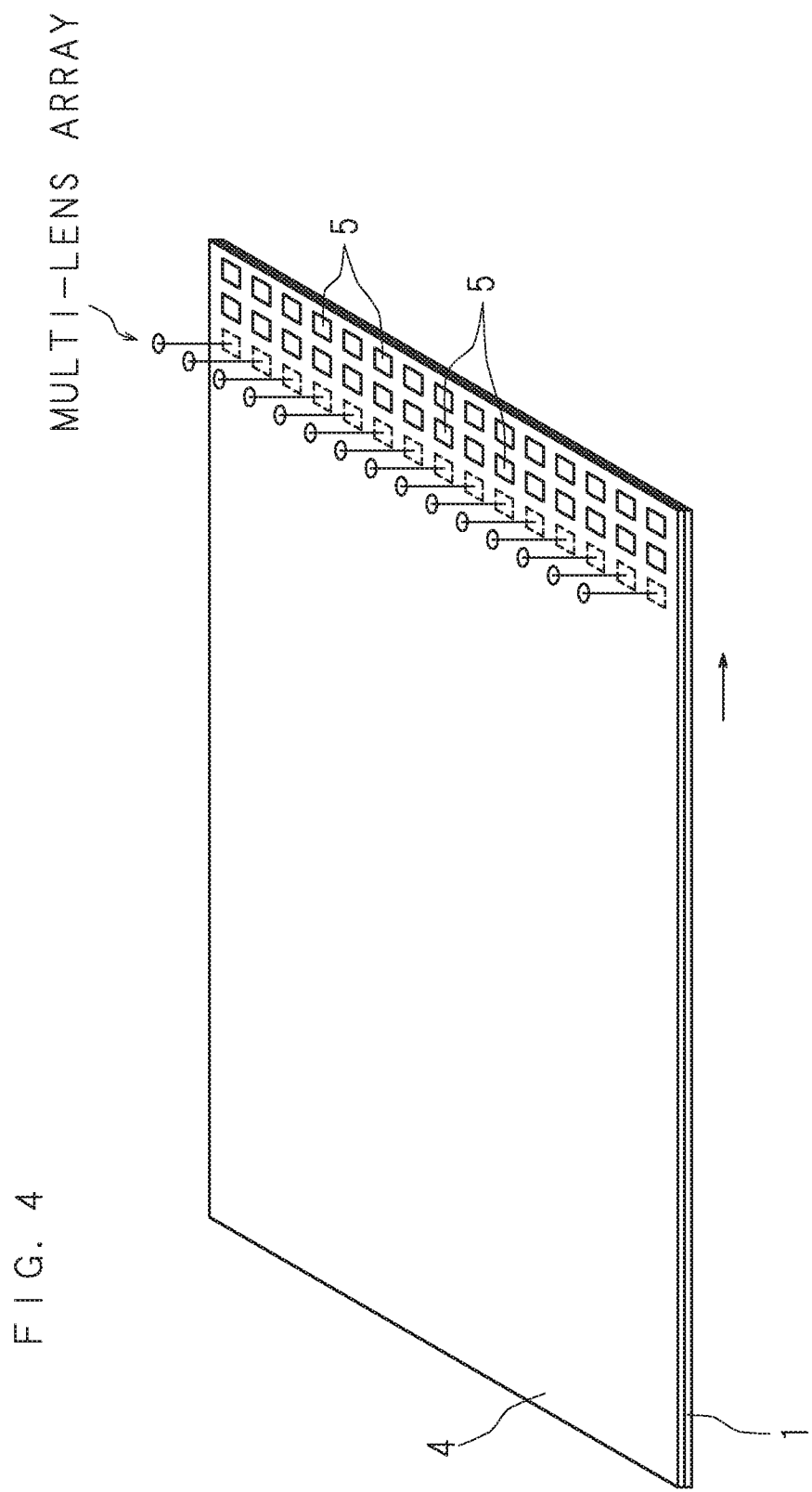
FIG. 4 is a schematic view illustrating an example of a configuration of a partial irradiation type laser.

FIG. 4 is a schematic view illustrating an example of a configuration of the partial irradiation type laser. As illustrated in FIG. 4, the glass substrate 1 on which the a-Si film 4 is formed is placed on a mount table (not illustrated), and is moved parallel to a direction shown by an arrow in FIG. 4 at a required speed. A multi-lens array, in which individual lenses are arranged at an appropriate length in a direction intersecting the moving direction of the glass substrate 1, is disposed above the glass substrate 1. A laser beam from a laser light source (not illustrated) is made incident on the multi-lens array, and thereby the laser beam is partially irradiated to a plurality of required places separated from each other via different optical paths for each lens. That is, partial laser annealing may be performed. Thereby, in the a-Si film 4, only the region to be the channel region is selectively changed to the polysilicon layer (poly-Si film) 5.

Then, cleaning prior to film formation is performed (S17), and by covering the polysilicon layer 5 that has been in the polycrystalline state by the annealing process, the a-Si film 6 as the second amorphous silicon layer is formed (S18). The n+ Si film (n+ silicon layer) 7 is formed on the surface of the a-Si film 6 (S19). The n+ Si film 7 is a contact layer with the source electrode 8 and the drain electrode 9, and is a semiconductor layer having a high impurity concentration such as phosphorus or arsenic.

Next, exposure and development process are performed (S20), and a required pattern is formed on the n+ Si film (n+ silicon layer) 7. The required pattern may be appropriately determined according to an arrangement or structure of the source electrode 8, the drain electrode 9 and the semiconductor layer. Then, in order to make the semiconductor layer have a required structure, the a-Si films 4 and 6 and the n+ Si film 7 are etched (S21), and the source electrode 8 and the drain electrode 9 are formed on the n+ Si film 7 after the etching (S22).

According to the manufacturing method of the present embodiment, the entire surface of the substrate is not irradiated with an energy beam (for example, laser), but, in the first amorphous silicon layer 4, only the region to be the channel region is partially irradiated with the energy beam, such that it is possible to form the channel region only by the annealing process. Therefore, it is not required for the polysilicon layer crystallized on the whole of the substrate surface to be subjected to each process of exposure, development and etching for forming the channel region, and thereby the manufacturing process may be shortened.

In addition, the annealing process is adapted to irradiate a required place with an energy beam so that the positions, in which at least one electrode of the source electrode 8 and the drain electrode 9 and the channel region are projected onto the surface of the glass substrate 1, are not overlapped with each other. The second amorphous silicon layer 6 is formed by covering the polysilicon layer 5 which is the channel region, and the source electrode 8 and the drain electrode 9 are formed on the upper side of the second amorphous silicon layer 6 through the n+ silicon layer 7. That is, since the second amorphous silicon layer 6 is provided so as to prevent the source and drain electrodes 8 and 9 and the channel region from directly contacting with each other, the feature of having a low leakage current (leak current) is used. The positions, in which at least one electrode of the source electrode 8 and the drain electrode 9 and the polysilicon layer 5 are projected onto the surface of the glass substrate 1, are prevented from being overlapped with each other, such that the leakage current may be further reduced.

Figure 5:
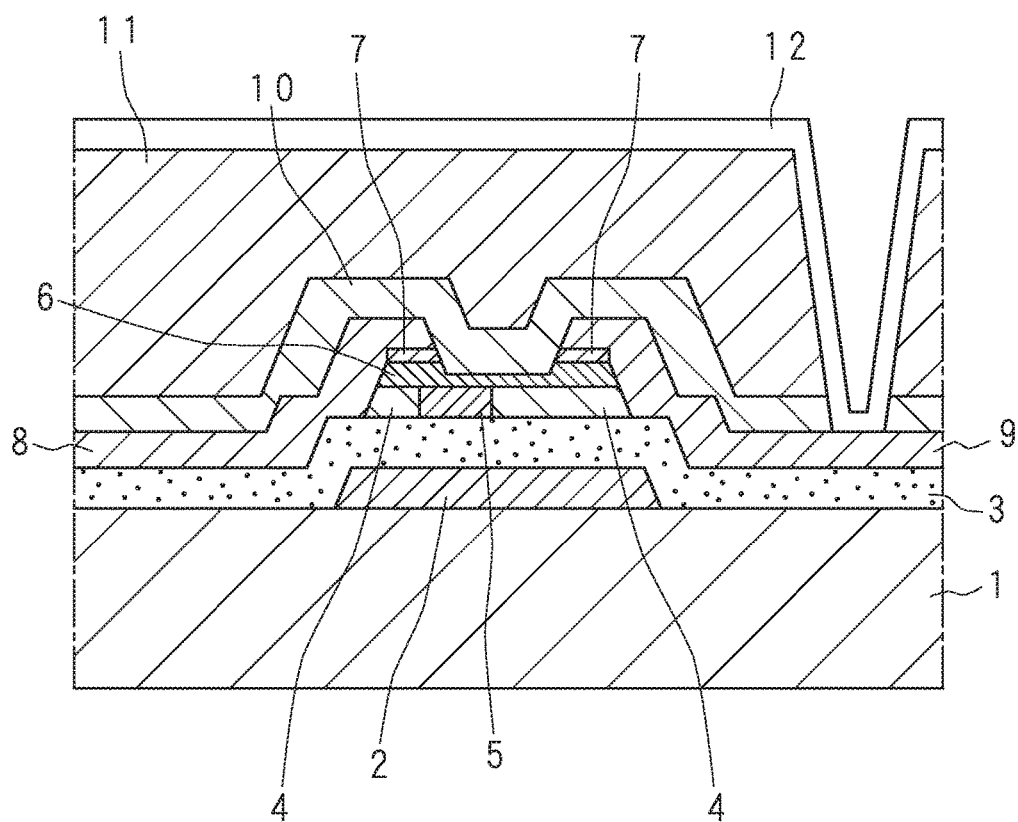
FIG. 5 is a schematic cross-sectional view of main components illustrating a second example of the structure of the thin film transistor according to the present embodiment.
Figure 6:
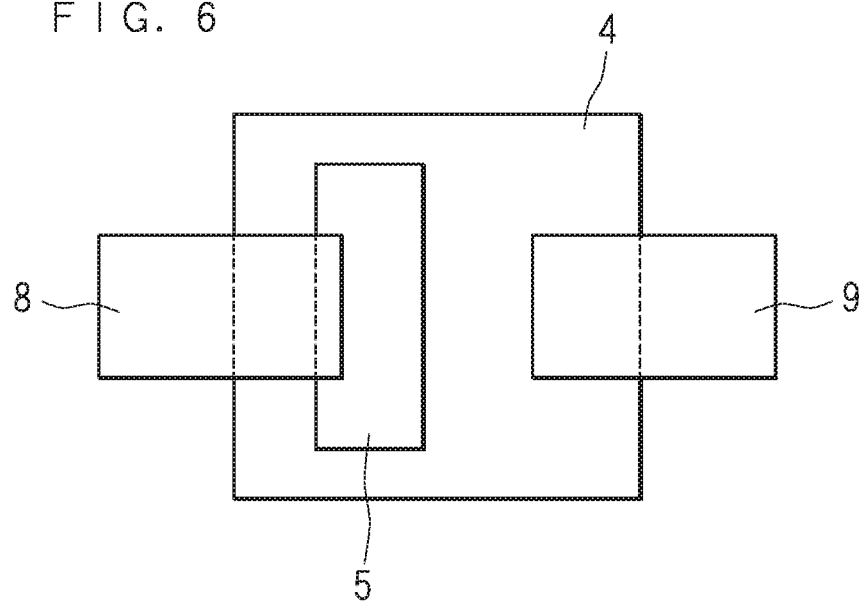
FIG. 6 is a schematic plan view of the main components illustrating the second example of the structure of the thin film transistor according to the present embodiment.

FIG. 5 is a schematic cross-sectional view of main components illustrating a second example of the structure of the thin film transistor according to the present embodiment, and FIG. 6 is a schematic plan view of the main components illustrating the second example of the structure of the thin film transistor according to the present embodiment. As illustrated in FIGS. 5 and 6, in the second example, the polysilicon layer 5 as the channel region is located nearer to the source electrode 8 side than in the first example. That is, as illustrated in FIG. 6, positions, in which the drain electrode 9 and the polysilicon layer 5 are projected on the surface of the glass substrate 1, are adapted so as not to be overlapped with each other. Thereby, it is possible to further reduce the leakage current between the drain electrode 9 and the polysilicon layer 5.

Figure 7:
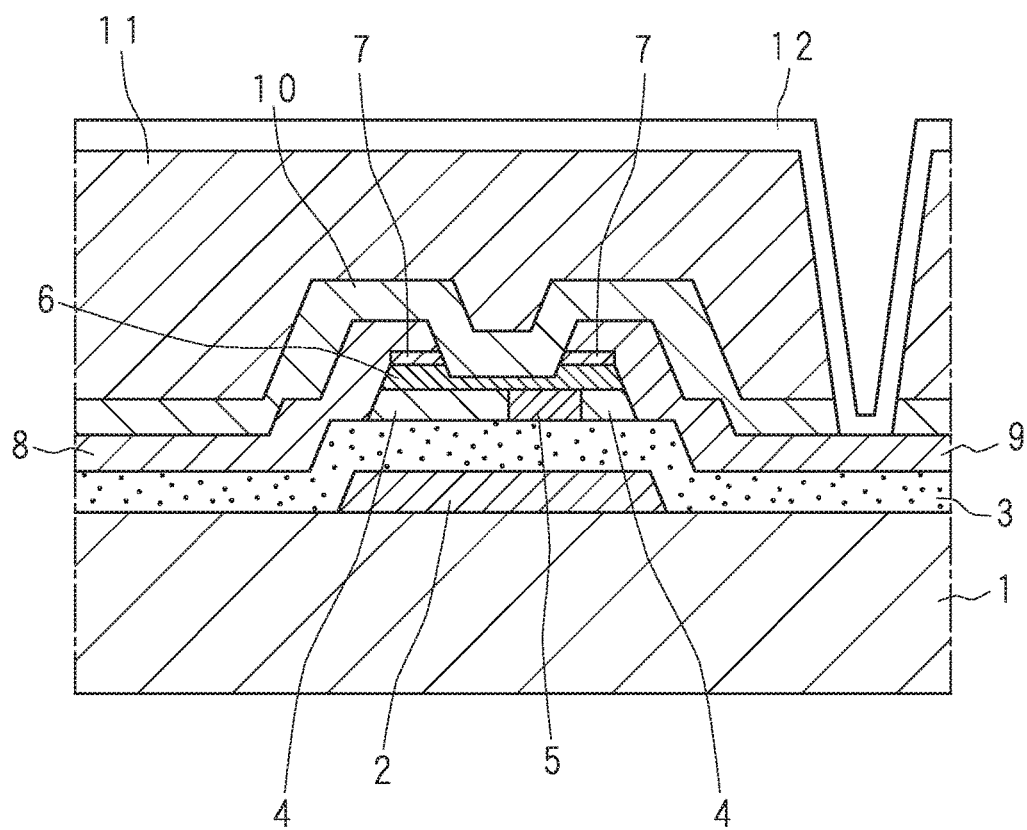
FIG. 7 is a schematic cross-sectional view of main components illustrating a third example of the structure of the thin film transistor according to the present embodiment.
Figure 8:
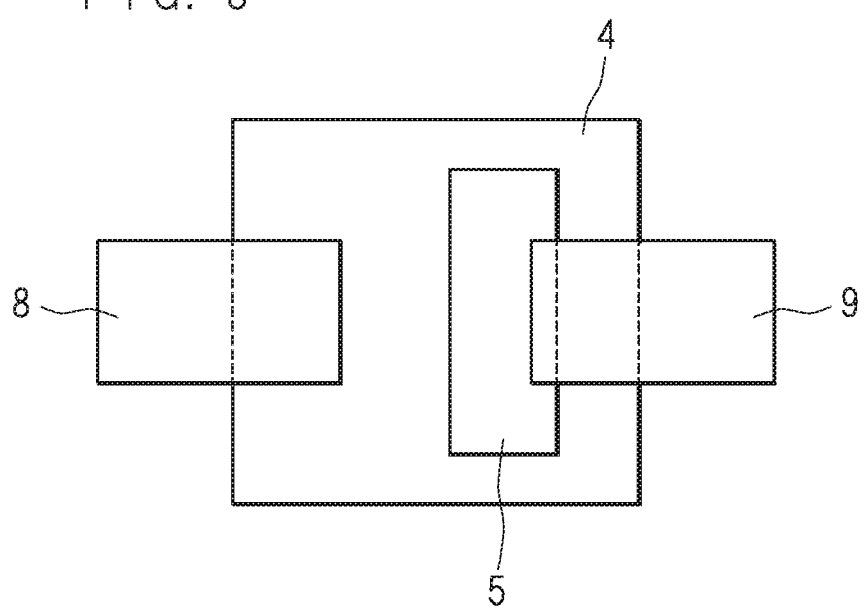
FIG. 8 is a schematic plan view of the main components illustrating the third example of the structure of the thin film transistor according to the present embodiment.

FIG. 7 is a schematic cross-sectional view of main components illustrating a third example of the structure of the thin film transistor according to the present embodiment, and FIG. 8 is a schematic plan view of the main components illustrating the third example of the structure of the thin film transistor according to the present embodiment. As illustrated in FIGS. 7 and 8, in the third example, the polysilicon layer 5 as the channel region is located nearer to the drain electrode 9 side than in the first example. That is, as illustrated in FIG. 8, positions, in which the source electrode 8 and the polysilicon layer 5 are projected on the surface of the glass substrate 1, are adapted so as not to be overlapped with each other. Thereby, it is possible to further reduce the leakage current between the source electrode 8 and the polysilicon layer 5.

As described above, the positions, in which at least one electrode of the source electrode 8 and the drain electrode 9 and the polysilicon layer 5 are projected onto the surface of the glass substrate 1, are adapted so as not to be overlapped with each other, such that the leakage current may be further reduced.

Figure 9:
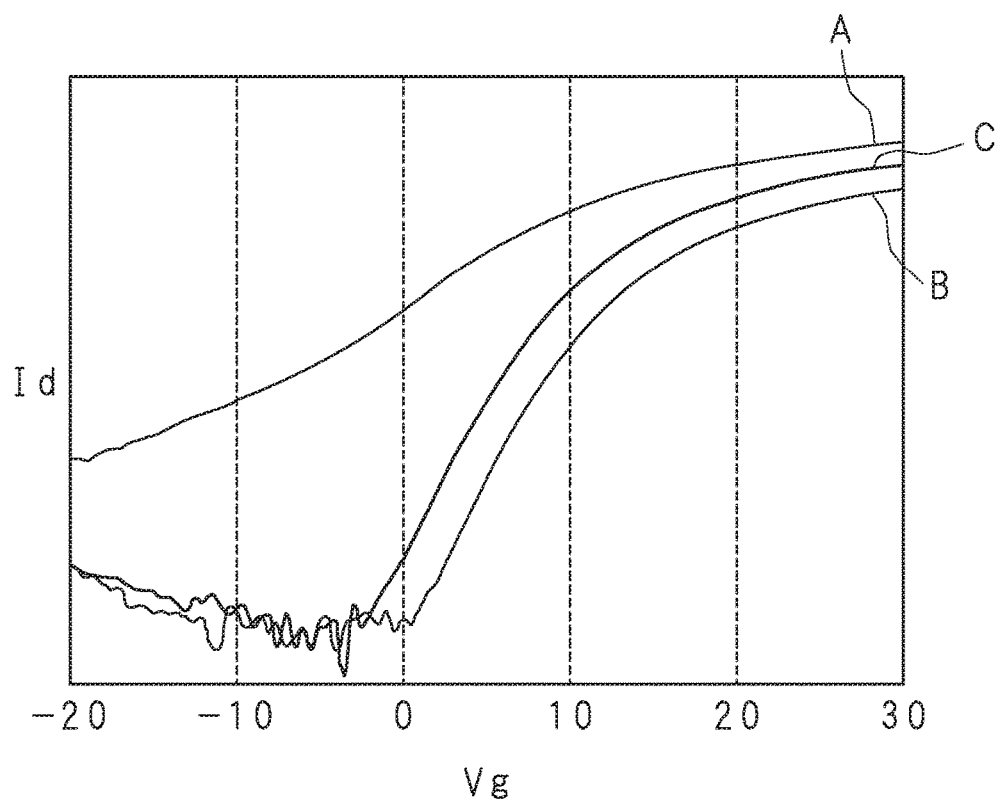
FIG. 9 is an explanatory view illustrating an example of Vg-Id characteristics of the thin film transistor according to the present embodiment.
Figure 10:
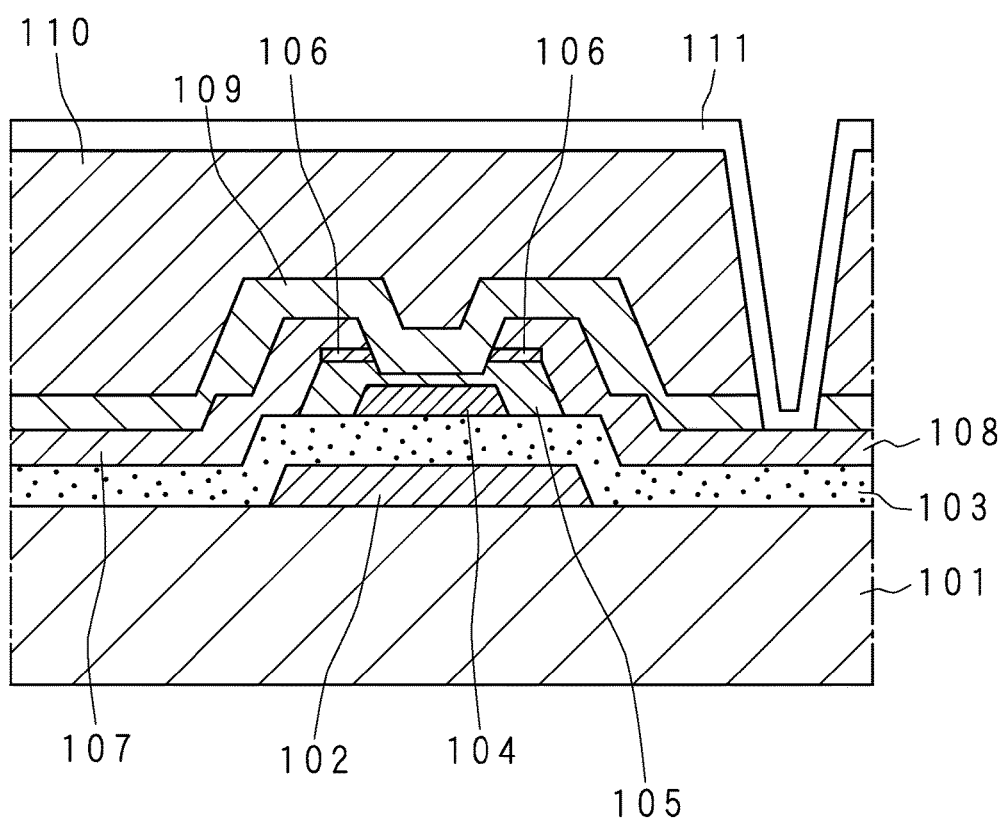
FIG. 10 is a schematic cross-sectional view of main components illustrating a structure of a conventional thin film transistor.
Figure 11:
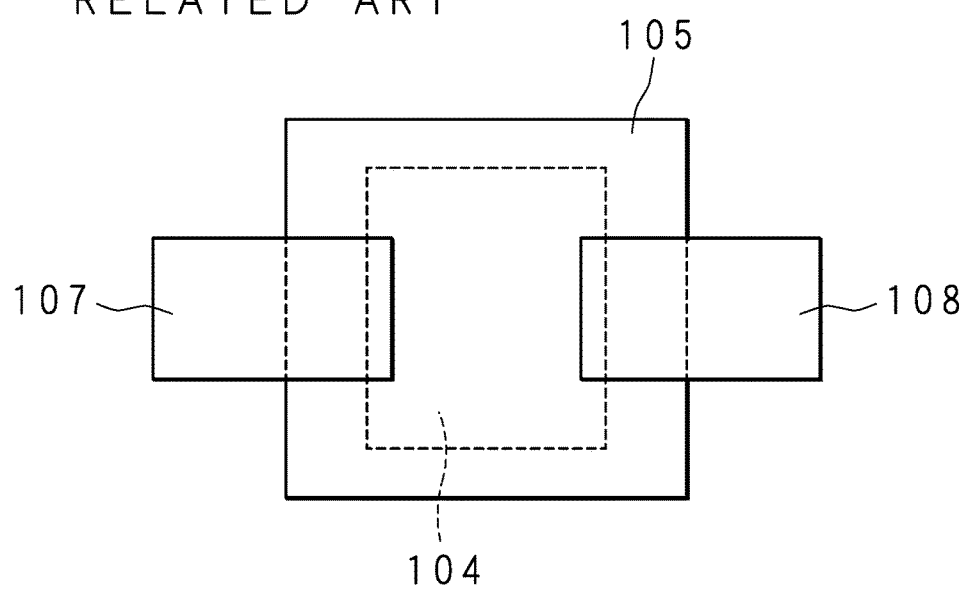
FIG. 11 is a schematic plan view of main components illustrating the structure of the conventional thin film transistor.

FIG. 9 is an explanatory view illustrating an example of Vg-Id characteristics of the thin film transistor according to the present embodiment. In FIG. 9, a horizontal axis represents Vg (a gate voltage), and a vertical axis represents Id (a drain current). In addition, a curve illustrated by symbol A in FIG. 9 represents, in a conventional TFT as illustrated in FIGS. 10 and 11 to be described below, characteristics in a case in which, when the channel region is formed into the polysilicon layer, and the source electrode, the drain electrode and the polysilicon layer are projected onto the surface of the glass substrate, a part of each of the source electrode and the drain electrode and a part of the polysilicon layer overlap with each other. A curve illustrated by symbol B in FIG. 9 represents characteristics of the conventional TFT in which the channel region is formed by the amorphous silicon layer. The polarity illustrated by symbol C in the drawing represents characteristics in a case of the second example of the present embodiment.

As illustrated in FIG. 9, the TFT (curve of symbol A) having a structure, in which a part of each of the source electrode and the drain electrode and a part of the polysilicon layer are overlapped with each other, may allow the electron mobility of the channel region to be more increased than the TFT (symbol B) in which the channel region is formed by the amorphous silicon layer, such that the drain current in an on-state may be increased, but the leakage current in an off-state is increased.

On the other hand, the TFT (curve C) of the present embodiment may allow the drain current in the on-state to be more increased than that in the case of the TFT (curve B) in which the channel region is formed by the amorphous silicon layer, and the leakage current in the off-state may be reduce to be approximately equal to the case of the TFT (curve of symbol B) in which the channel region is formed by the amorphous silicon layer.

Next, the conventional TFT as a comparative example will be described. FIG. 10 is a schematic cross-sectional view of main components illustrating a structure of the conventional thin film transistor, and FIG. 11 is a schematic plan view of main components illustrating the structure of the conventional thin film transistor. The conventional thin film transistor includes a gate electrode 102 formed on the surface of a glass substrate 101, and a gate insulation film 103 formed by covering the gate electrode 102. A polysilicon layer (poly-Si film) 104 is formed on the surface of the gate insulation film 103 and the upper side of the gate electrode 102.

An amorphous silicon layer (a-Si film) 105 is formed on the polysilicon layer 104 so as to cover the same. An n+ silicon layer (n+ Si film) 106 is formed at a required position on the surface of the amorphous silicon layer 105. A source electrode 107 and a drain electrode 108 respectively having a required pattern are formed on the surface of the n+ silicon layer 106, the side face of the amorphous silicon layer 105, and the surface of the gate insulation film 103.

In addition, as illustrated in FIG. 11, when the polysilicon layer 104 which is the channel region, the source electrode 107 and the drain electrode 108 are projected onto the surface of the glass substrate, a part of each of the source electrode 107 and the drain electrode 108 and a part of the polysilicon layer 104 are overlapped with each other.

Figure 12:
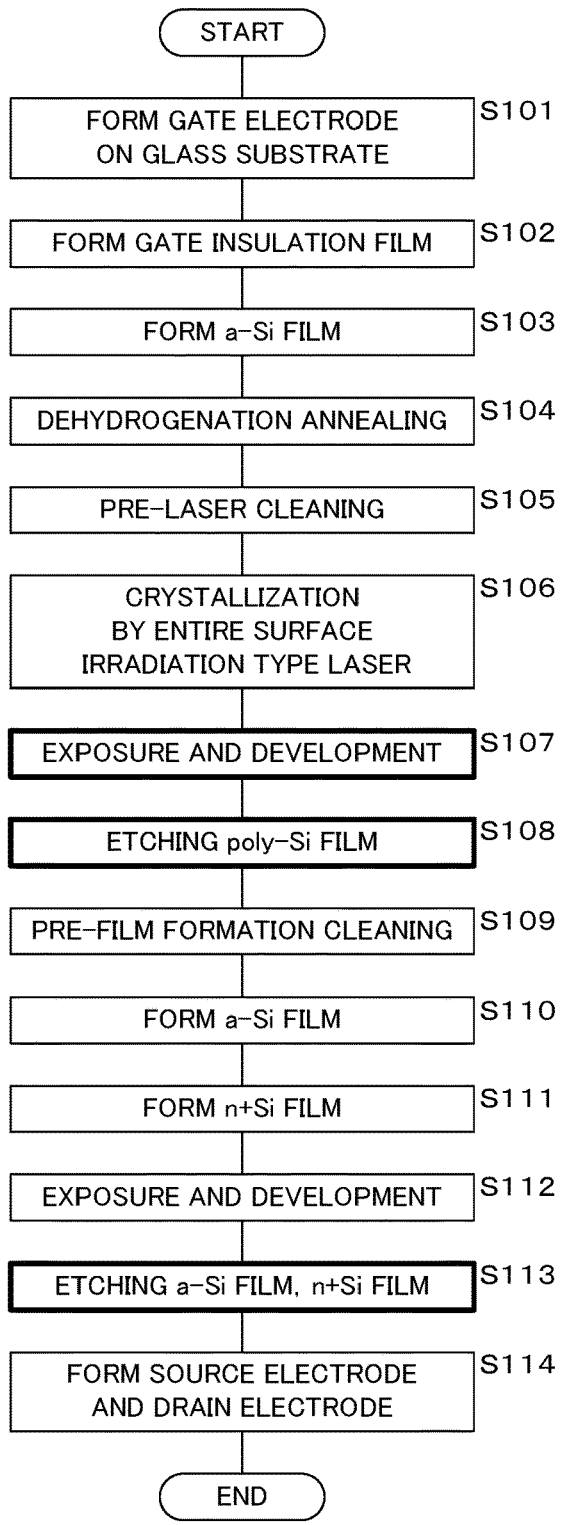
FIG. 12 is a flow chart of manufacturing processes illustrating a method for manufacturing the conventional thin film transistor.

FIG. 12 is a flow chart of manufacturing processes illustrating a method for manufacturing the conventional thin film transistor. As illustrated in FIG. 12, the gate electrode 102 is formed on the glass substrate 101 (S101), and the gate insulation film 103 is formed on the surface of the glass substrate 101 by covering the gate electrode 102 (S102).

An a-Si film is formed on the surface of the glass substrate 101 on which the gate insulation film 103 is formed (S103). In order to laser anneal the a-Si film, dehydrogenation annealing treatment is performed (S104), and cleaning prior to laser treatment is performed (S105).

Next, crystallization of the a-Si film by an entire surface irradiation type laser is performed (S106).

Figure 13:
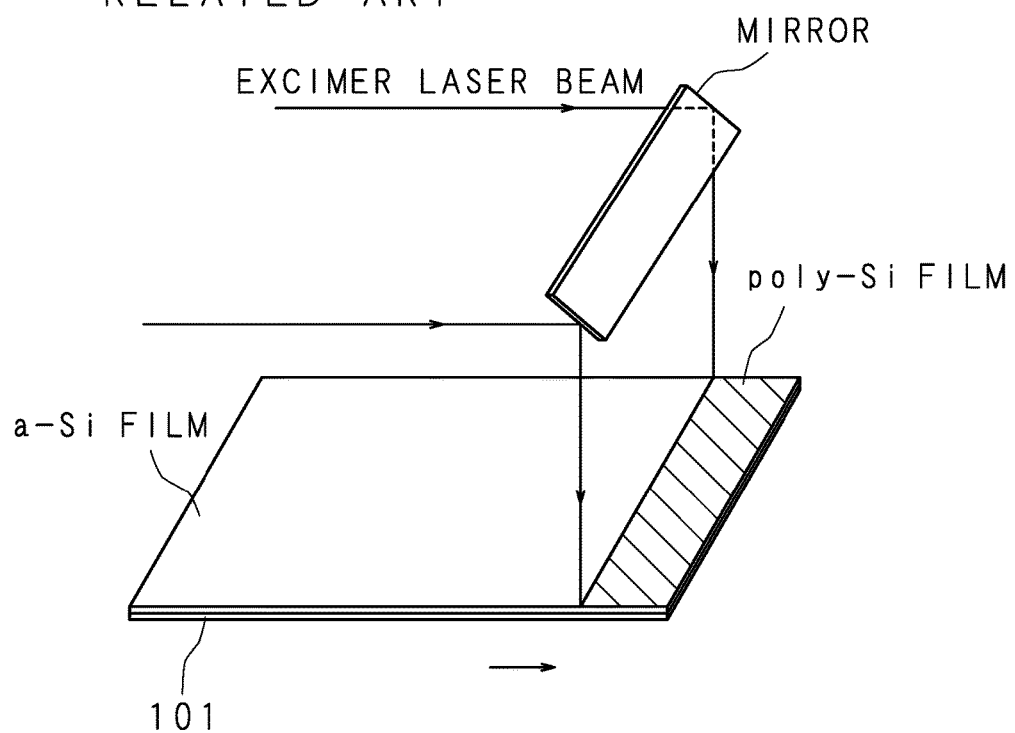
FIG. 13 is a schematic view illustrating an example of a configuration of an entire surface irradiation type laser.

FIG. 13 is a schematic view illustrating an example of a configuration of the entire surface irradiation type laser. As illustrated in FIG. 13, the glass substrate 101 on which the a-Si film is formed is placed on a mount table (not illustrated), and is moved parallel to a direction shown by an arrow in FIG. 13 at a required speed. A mirror having a length substantially the same as the dimension in a width direction of the glass substrate 101 (direction intersecting the direction of parallel movement) is disposed above the glass substrate 101. A laser beam from a laser light source (not illustrated) is made incident on the mirror, thereby the laser beam is irradiated to the entire surface of the glass substrate 101. As a result, all of the a-Si film is changed to the polysilicon layer (poly-Si film).

Next, exposure and development process are performed on the polysilicon layer (poly-Si film) formed on the whole of the surface of the glass substrate 101 (S107), and further etching processing is performed thereon (S108). Thereby, the polysilicon layer 104 as the channel region is formed.

Then, cleaning prior to film formation is performed (S109), and the a-Si film 105 is formed by covering the polysilicon layer 104 (S110). The n+ Si film (n+ silicon layer) 106 is formed on the surface of the a-Si film 105 (S111).

Next, exposure and development process are performed (S112), and in order to make the semiconductor layer have a required structure, the a-Si film 105 and the n+ Si film 106 are etched (S113). Then, the source electrode 107 and the drain electrode 108 are formed on the n+ Si film 106 after the etching (S114).

As illustrated in FIG. 12, as compared to the conventional case in which, after the amorphous silicon layer formed on the whole of the substrate surface is changed to the polysilicon layer by irradiating the entire surface of the substrate with an energy beam (for example, laser), each process of exposure, development and etching is performed on the polysilicon layer to form the channel region, according to the manufacturing method of the present embodiment, the entire surface of the substrate is not irradiated with the energy beam (for example, laser), but, in the first amorphous silicon layer, only the region to be the channel region is partially irradiated with the energy beam, such that it is possible to form the channel region only by the annealing process. Therefore, each process of exposure, development and etching (steps S107 and S108 illustrated in FIG. 12) for forming the channel region is not required, and thereby the manufacturing process may be shortened.

The thin film transistor of the present embodiment may be used for a display panel. That is, the thin film transistor (TFT substrate) of the present embodiment and a color filter substrate having red (R), green (G) and blue (B) colors are bonded to each other at a required gap, and liquid crystal is injected and sealed between the TFT substrate and the color filter substrate, such that a TFT type liquid crystal display panel (liquid crystal display) may be manufactured. Thereby, it is possible to provide a display panel capable of shortening the manufacturing process.

In the case of the conventional entire surface irradiation type laser, it is configured to irradiate the entire surface of the glass substrate with the laser beam. Therefore, for example, for a substrate having a larger size than the sixth generation, there is no laser transmission source that can uniformly irradiate the laser beam, and there is a problem that crystallinities within the substrate surface become different from each other so as to cause unevenness in a characteristic distribution, and thereby resulting in poor quality.

However, when using the partial irradiation type laser in the present embodiment, it is sufficient to irradiate only the required place on the substrate, not the entire substrate, such that even if the substrate size is increased (for example, in the tenth generation), the problem that the crystallinities of the polysilicon layer become different from each other so as to cause unevenness in the characteristic distribution may be solved. Further, in the laser annealing using the multi-lens array as illustrated in FIG. 4, the line width of the channel region may be more easily controlled than in the case of using the conventional exposure, development and etching processes, and the thin film transistor may be easily manufactured.

It is to be noted that, as used herein and in the appended claims, the singular forms "a", "an", and "the" include plural referents unless the context clearly dictates otherwise.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A method for manufacturing a thin film transistor, comprising:
   forming a gate electrode on a surface of a substrate;
   forming an insulation film on the surface of the substrate on which the gate electrode is formed;
   forming a first amorphous silicon layer on the surface of the substrate on which the insulation film is formed;
   annealing a plurality of required places separated from each other on the first amorphous silicon layer by irradiating an energy beam to change the required places to a polysilicon layer;
   forming a second amorphous silicon layer by covering the polysilicon layer;
   forming an n+ silicon layer on a surface of the second amorphous silicon layer;
   forming a required pattern on the n+ silicon layer;
   etching the first amorphous silicon layer, the second amorphous silicon layer and the n+ silicon layer; and
   forming a source electrode and a drain electrode on the n+ silicon layer after the etching,
   wherein the annealing is adapted to irradiate the energy beam so that the polysilicon layer and at least one electrode of the source electrode and the drain electrode do not overlap with each other and are separated by a predetermined distance from each other at positions in which they are projected onto the surface of the substrate.

2. A thin film transistor, comprising:
   a gate electrode formed on a surface of a substrate;
   a polysilicon layer formed on a surface of a gate insulation film and an upper side of the gate electrode;
   a first amorphous silicon layer formed on a surface of the gate insulation film and an upper side of the gate electrode and around the polysilicon layer, and has a thickness approximately equal to the thickness of the polysilicon layer;
   a second amorphous silicon layer formed so as to cover at least a surface of the first amorphous silicon layer;
   an n+ silicon layer formed on the second amorphous silicon layer; and
   a source electrode and a drain electrode formed on the n+ silicon layer,
   wherein the polysilicon layer and at least one electrode of the source electrode and the drain electrode do not overlap with each other and are separated by a predetermined distance from each other at positions in which they are projected onto the surface of the substrate.

3. The thin film transistor according to claim 2, wherein the second amorphous silicon layer is formed so as to cover surfaces of the polysilicon layer and the first amorphous silicon layer.

4. The thin film transistor according to claim 2, wherein a boundary surface between the polysilicon layer and the first amorphous silicon layer is substantially perpendicular to the surface of the substrate.

5. A display panel comprising the thin film transistor according to claim 2.

6. The thin film transistor according to claim 2, wherein the polysilicon layer and each of the source electrode and the drain electrode do not overlap with each other and are separated by a predetermined distance from each other at positions in which they are projected onto the surface of the substrate.

7. The thin film transistor according to claim 2, wherein the polysilicon layer and other electrode of the source electrode and the drain electrode are adapted so as to be overlapped with each other at positions in which they are projected onto the surface of the substrate.

* * * * *